US00RE43623E

(19) United States
(12) Reissued Patent
Tsukamoto

(10) Patent Number: US RE43,623 E
(45) Date of Reissued Patent: Aug. 28, 2012

(54) METHOD AND APPARATUS FOR SIMULATING LOGIC CIRCUITS THAT INCLUDE A CIRCUIT BLOCK TO WHICH POWER IS NOT SUPPLIED

(75) Inventor: Yasutaka Tsukamoto, Yokohama (JP)

(73) Assignee: Ricoh Company, Ltd., Tokyo (JP)

(21) Appl. No.: 12/640,904

(22) Filed: Dec. 17, 2009

Related U.S. Patent Documents

Reissue of:
(64) Patent No.: 7,310,795
Issued: Dec. 18, 2007
Appl. No.: 11/179,660
Filed: Jul. 13, 2005

(30) Foreign Application Priority Data

Jul. 14, 2004 (JP) ..... 2004-206740

(51) Int. Cl.
*G06F 17/50* (2006.01)
*G06F 9/455* (2006.01)

(52) U.S. Cl. ..... 716/133; 716/100; 716/101; 716/108; 716/109; 716/110; 716/132; 716/134; 716/138; 703/13; 703/14; 326/56; 326/57; 326/58; 327/365; 327/376; 327/377

(58) Field of Classification Search ..... 716/100–101, 716/108–110, 114, 132–134, 138; 703/13–14; 326/56–58; 327/365, 376, 377
See application file for complete search history.

(56) References Cited

U.S. PATENT DOCUMENTS

| | | | | |
|---|---|---|---|---|
| 5,768,145 | A | 6/1998 | Roethig | |
| 6,460,168 | B1 | 10/2002 | Yamamoto et al. | |
| 6,490,715 | B1 * | 12/2002 | Moriwaki et al. | 716/108 |
| 6,598,209 | B1 | 7/2003 | Sokolov | |
| 6,684,378 | B2 | 1/2004 | Yamamoto et al. | |
| 6,711,719 | B2 | 3/2004 | Cohn et al. | |
| 6,928,401 | B1 | 8/2005 | Wanek | |

FOREIGN PATENT DOCUMENTS

| | | |
|---|---|---|
| JP | 2000-305961 | 11/2000 |
| JP | 2000-305961 A | 11/2000 |

* cited by examiner

*Primary Examiner* — Nghia Doan
(74) *Attorney, Agent, or Firm* — Dickstein Shapiro LLP

(57) ABSTRACT

A logic circuit simulation apparatus used in designing a logic IC (integrated circuit) is provided. The logic circuit simulation apparatus includes a power control signal specifying unit which creates power control signal information for specifying statuses of a plurality of power control signals, a logic circuit simulation control information generation unit which reads the power control signal information and related circuit connection information and generates a logic circuit simulation control information based on the power control signal information and the circuit connection information, and a logic circuit simulation unit which fixes with high impedance each input of a circuit block to which power is not supplied in accordance with the logic circuit simulation control information, simulating the logic circuit.

21 Claims, 4 Drawing Sheets

```
module BUFFER (I1,O1);
input I1;
output O1;
    assign O1 = I1;
endmodule
```

EXAMPLE OF THE DESCRIPTION OF THE BUFFER CIRCUIT OPERATION

METHOD AND APPARATUS FOR SIMULATING LOGIC CIRCUITS THAT INCLUDE A CIRCUIT BLOCK TO WHICH POWER IS NOT SUPPLIED

Matter enclosed in heavy brackets [ ] appears in the original patent but forms no part of this reissue specification; matter printed in italics indicates the additions made by reissue.

CROSS-REFERENCE TO RELATED APPLICATIONS

This patent application claims priority to Japanese patent application No. 2004-206740 filed on Jul. 14, 2004 in the Japan Patent Office, the entire content of which is incorporated by reference herein.

FIELD OF THE INVENTION

The present invention relates to a method and apparatus for simulating a logic circuit, and more particularly to a method and apparatus for simulating a logic circuit that includes a circuit block to which power is not supplied.

BACKGROUND OF THE INVENTION

In recent years, power reduction technology for logic IC (integrated circuit) has been studied and developed. To get a low power consumption IC, a circuit configuration to which power is selectively supplied to circuit blocks has been employed. More specifically, power is supplied to the circuit blocks which need power to perform a task and not supplied to other circuit blocks which do not perform the task.

However, conventional logic simulators request a circuit description which represents every circuit block of the logic circuit operating under the supply of power. Therefore, the conventional logic simulators cannot handle the circuit description for a logic circuit to which power is selectively supplied to circuit blocks of the logic circuit and described with cell descriptions retrieved from cell libraries for IC design using commercial CAD tools. In order to simulate the circuit configuration using the conventional simulator, the logic circuit is required to be classified into small circuit blocks, for example, a power supply circuit block and logic circuit blocks, and each circuit block is needed to be simulated separately under different conditions. Then, all executed simulation results are collected to consider a total power consumption of the IC circuit. When the conventional simulator is used for design verification, additional manual labor may be needed to adjust connections between the circuit blocks and functional simulations are needed to perform for the individual circuit block. Consequently, it become very complicated to get the total simulation result and a lot of additional efforts are needed.

There has been proposed one technique which recreates a cell library by adding power terminals to all cells. However, it requires a lot of additional work to prepare new cells manually and maintain the additional new cell library besides the cell library which is commonly used for the IC design. Moreover, the processes used to add terminals to the cells and to connect the circuit blocks are not able to be implemented in RTL (register transfer level) design methodology, which is commonly used in IC design, but are instead only implemented in a gate level design methodology.

BRIEF SUMMARY OF THE INVENTION

The invention provides a novel logic circuit simulation apparatus used in designing Logic ICs. The logic circuit simulation apparatus includes a power control signal specifying unit which creates power control signal information for specifying statuses of a plurality of power control signals, a logic circuit simulation control information generation unit which reads the power control signal information and related circuit connection information and generates logic circuit simulation control information based on the power control signal information and the circuit connection information, and a logic circuit simulation unit which fixes with high impedance each input of a circuit block to which power is not supplied in accordance with the logic circuit simulation control information, simulating the logic circuit.

The invention also provides a novel logic circuit simulation apparatus which includes a delay time specifying unit which specifies a power-off delay time for the circuit block to which power is not to be supplied and specifies the power-on delay time for the circuit block to which power is to be supplied.

The invention further provides a novel logic circuit simulation method which has steps of creating power control signal information for specifying statuses of a plurality of power control signals, specifying delay time from a time the power control signal is changed to a time the power of the circuit block is not supplied for each circuit block, reading the power control signal information, the circuit connection information and the delay time information, generating logic circuit simulation control information based on the power control signal information, the circuit connection information and the delay time information, reading the logic circuit simulation control information for instructing a logic circuit simulation unit to fix with high impedance each input of a circuit block to which power is not supplied and simulating the logic circuit in accordance with the logic circuit simulation control information.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
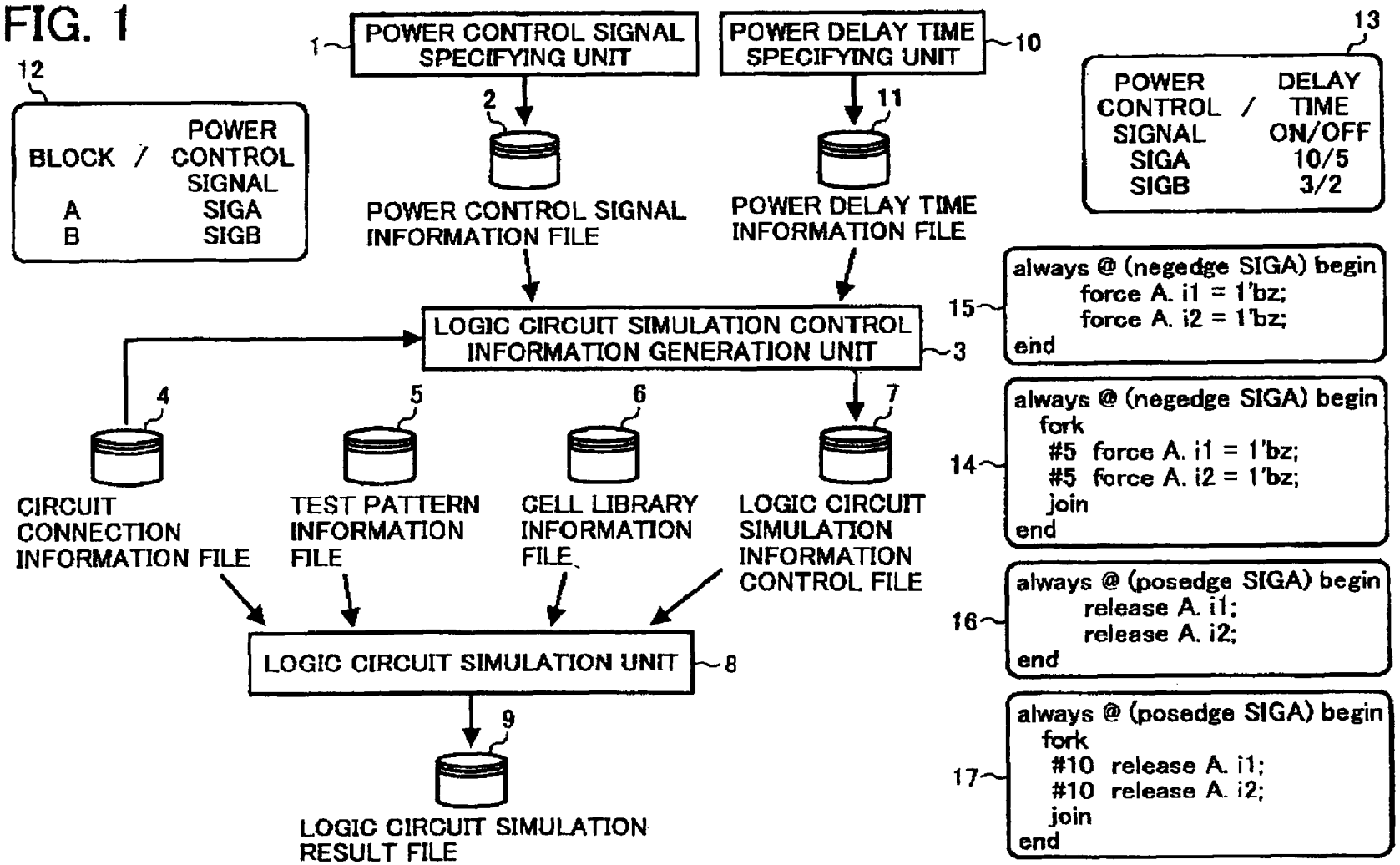
FIG. 1 illustrates a logic circuit simulation apparatus according to an embodiment of the present invention.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIGS. 1 and 2, a logic circuit simulation apparatus according to an embodiment of the present invention and an example logic circuit to be simulated by the logic circuit simulation apparatus is now described. FIG. 1 illustrates the logic circuit simulation apparatus and FIG. 2 illustrates an example logic circuit 20 which uses multiple powers and is simulated by the logic circuit simulation apparatus of FIG. 1.

Figure 2:
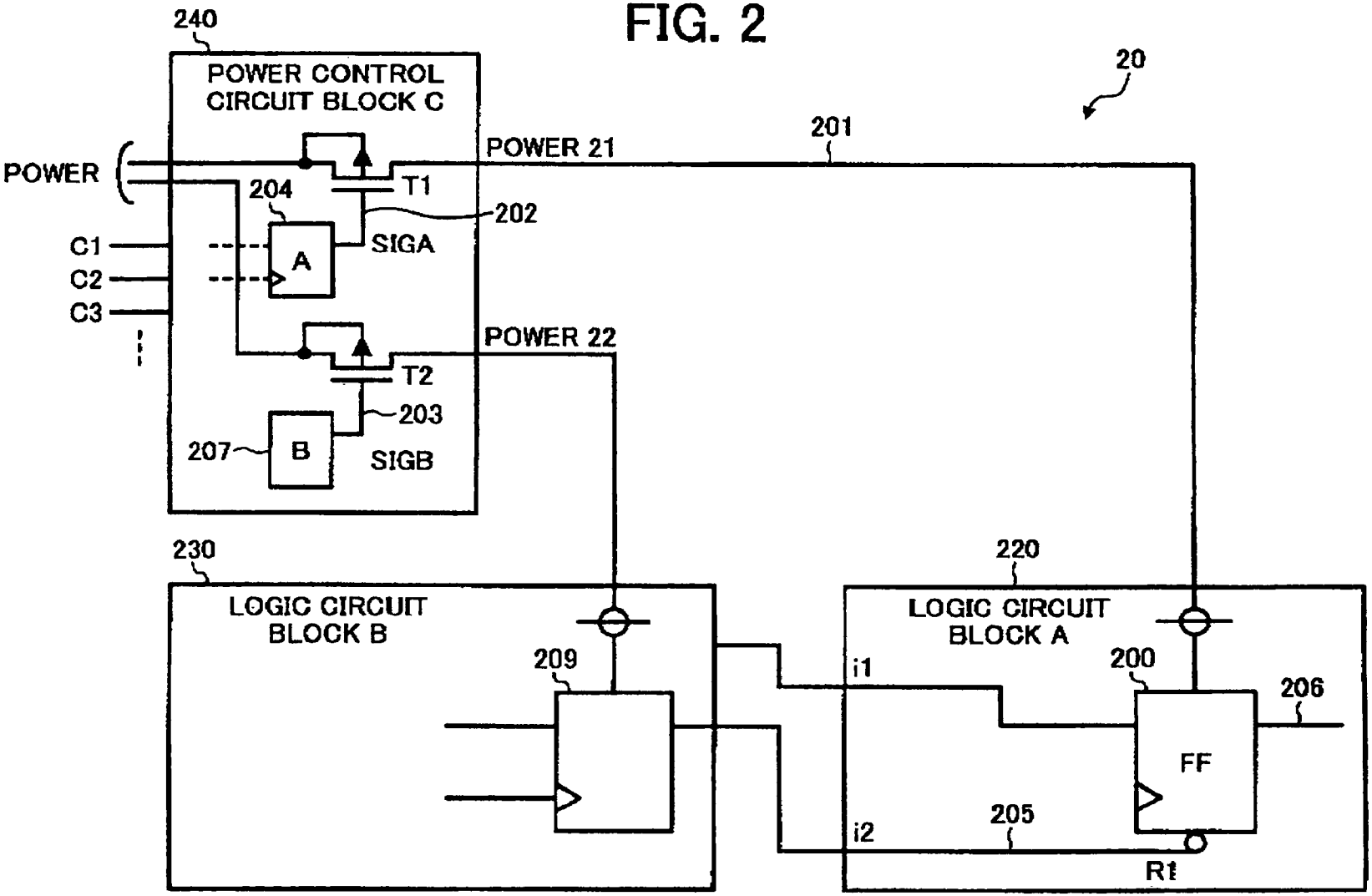
FIG. 2 illustrates an example logic circuit to be simulated by the logic circuit simulation apparatus.

In FIG. 2, the logic circuit 20 includes a logic circuit block A 220, a logic circuit block B 230 and a power control circuit block C 240. The power control circuit provides powers 21 and 22. Power 21 is a power output from the power control circuit block C 240 and is controlled by an output of a flip flop 204 in the power control circuit block C 240. Power 21 is supplied to a flip flop 200 in the logic circuit block A 220. Power 22 is another power output from the power control circuit block C 240 and is controlled by the output of a flip flop 207 in the power control circuit block C 240. Power 22 is supplied to a flip flop 209 in the logic circuit block B 230. The flip flop 204 controls a switching transistor Ti by outputting a signal at node 202. The signal at node 202 is called SIGA and is defined as a power control signal. The flip flop 207 controls a switching transistor T2 by outputting a signal at node 203. The signal at node 203 is called SIGB and is also defined as a power control signal.

In order to make the flip flop 200 reset, power 21 is needed to be turned on in advance. Namely, the flip flop 204 is needed to be set in advance to make power 21 active. If the power 21 is off in an initial state, node 201 is in a floating state. The flip flop 200 cannot properly be reset under the floating condition of power, even if a set signal R1 at node 205 become logical "0" by an output of the flip flop 209 in logic circuit block B 230. In this case, the output at node 206 of the flip flop 200 may not be predictable and the value may be logical "0" or logical "1".

The logic circuit simulation apparatus in FIG. 1 includes a power control signal specifying unit 1, a power delay time specifying unit 10, a logic circuit simulation control information generation unit 3, a logic circuit simulation unit 8 (logic simulator) and various information files. The information files include a power control signal information file 2, a power delay time information file 11, a circuit connection information file 4, a test pattern information file 5, a cell library information file 6, a logic circuit simulation information control file 7 and a logic circuit simulation result file 9. Descriptions 12 and 13 are examples of the power control signal information file 2 and the power delay time information file 11, respectively. Descriptions 14, 15, 16 and 17 are example statements of forcing values and releasing values to instruct the logic circuit simulation unit 8.

According to a first embodiment, the power control signal specifying unit 1 specifies a signal which stops or starts to supply power and generates power control signal information. In FIG. 2, the signal SIGA at node 202 is an example of a power control signal. The description 12 in FIG. 1 is an example of the power control signal information file 2. The logic circuit blocks A and B, 220 and 230, and the power control signals SIGA and SIGB are referred in the description of the power control signal information 12. The description of the power control signal information 12 describes that the power to the logic circuit block A 220 is controlled by the power control signal SIGA. Moreover, the power is supplied when the power control signal SIGA is logical "1" and not supplied when power control signal SIGA is logical "0". The specification of the power control signal can be implemented by the commercial CAD software tool, or manually. The logic circuit simulation control information generation unit 3 reads the circuit connection file 4 and the power control signal information file 2, then generates a logic circuit simulation control information file 7. The description 15 in FIG. 1 shows an example of logic circuit simulation control information which is written by standard CAD language Verilog-HDL (hardware description language). The description 15 describes an instruction that command is sent to the logic simulator to fix with logical "Z" the input ports of logic circuit block A 220, i1 and i2, when the logical value of the power control signal SIGA is changed from 1 to 0. The information on the input ports i1 and i2 is retrieved from the circuit connection information file 4. When the input ports i1 and i2 of the logic circuit block A 220 are fixed to a logical value of "Z", the values at the input ports i1 and i2 of the logic circuit lock A 220 are kept as logical "Z" during the simulation even if a signal of logical "1" or logical "0" is fed from the logic circuit block B 230 to the input ports i1 and i2 of the logic circuit block A 220.

When logical "Z" is inputted to a cell of the cell library, the cell outputs logical "X" in general. The logical "X" expresses an unfixed value which may not be logical "1" or logical "0". This situation corresponds to the actual circuit operation to which power is not supplied. If every input of the block A is fixed to logical "Z", logical "X" is transmitted in the block A. Therefore, it is possible to simulate the circuit including the circuit block to which power is not supplied by applying logical "Z" to the inputs of the circuit block. It is also possible to fix every output of the logic circuit block A 220 with logical "Z" in addition to the fixation of every input with logical "Z". The logic circuit simulation unit 8 performs the simulation after reading the circuit connection information file 4, the test pattern information file 5 and the cell library information file 6 which are commonly used in the background logic simulation and the logic circuit simulation information control file 7. Namely, the equivalent simulation result to the actual circuit operation with no power supply to the logic circuit block A 220 can be obtained using this procedure.

A second embodiment introduces a power delay time specifying unit 10. The power delay time specifying unit 10 is an additional element of the logic circuit simulation apparatus and generates the power delay time information file 11 which specifies a power delay time. The power delay time is defined as a time period from a time power control signal becomes active (logical "1") to a time the power is supplied to the circuit block. For example, it is the power delay time from a time the power control signal SIGA becomes logical "1" to a time the power 21 goes up to a predetermined high potential. The power delay time is also defined as a time period from a time power control signal becomes non-active (logical "0") to a time the power is stopped to supply to the circuit block. For example, it is the delay time from a time the power control signal SIGA becomes logical "0" to a time power 21 goes down to a predetermined low potential. The description 13 in FIG. 1 is an example of the power delay time information. The description 13 describes that power 21 at node 201 goes up to the predetermined high potential upon an elapse of a time value of 10 after the power control signal SIGA becomes logical "1" and power 21 at node 201 goes down to the predetermined low potential upon an elapse of a time value of 5 after SIGA becomes logical "0". The logic circuit simulation control information generation unit 3 reads the power control signal information file 2, the circuit connection file 4 and the power delay time information file 11, and accordingly generates a logic circuit simulation information control file 7. The description 14 in FIG. 1 is an example of the logic circuit simulation control information written by standard language Verilog-HDL. The description 14 describes that the input ports i1 and i2 of the logic circuit block A 220 are to be set logical "Z" upon an elapse of a time value of time 5 after SIGA is changed from logical "1" to logical "0". The input ports i1 and i2 are retrieved from the circuit connection file 4. The logic circuit simulation unit 8 performs the simulation using the circuit connection information file 4, the test pattern information file 5 and the cell library information file 6 which are commonly used in the background logic simulation and the logic circuit simulation information control file 7. Namely, the simulation result with the delay time equivalent to the actual case where the power is not supplied to the logic circuit block A 220 can be obtained using this procedure.

A third embodiment covers a situation where the power is supplied again to the circuit block which consequently begins to work. The logic circuit simulation control information with release condition is generated as shown in the description 16 in FIG. 1. The description 16 describes that each of the input ports i1 and i2 of the logic circuit block A 220 is released by an application of a fixed input value when SIGA is changed from logical "0" to logical "1". The circuit block to which power is supplied again is now simulated in a procedure similar to the background method. Accordingly, the logic circuit operation to which the power is supplied again to the circuit block which consequently begins to work can be simulated.

A fourth embodiment covers a situation where the power is supplied again to the circuit block which consequently begins to work after a delay. The logic circuit simulation control information with release conditions including a delay time is generated as shown in the description 17 in FIG. 1. The description 17 means that each of the input ports i1 and i2 of the logic circuit block A 220 is released by an application of a fixed value upon an elapse of the time value of 10 after the power control signal SIGA is changed from logical "0" to logical "1". The circuit block to which power is going to be supplied is now able to be simulated in a way similar to the background method. Accordingly, a logic circuit in which the power is supplied again to the circuit block which consequently begins to work can be simulated with consideration of delay time.

Figure 3:
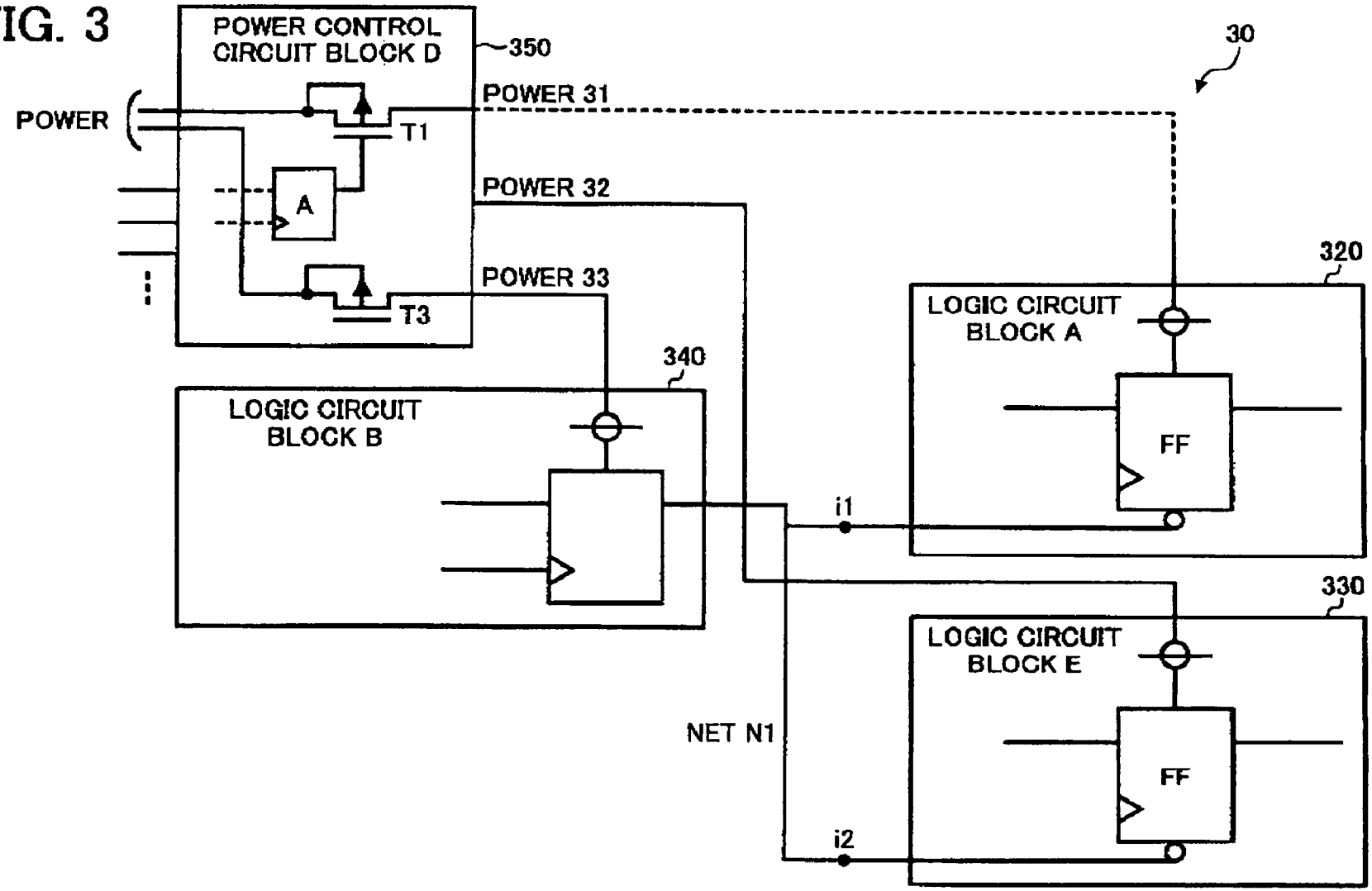
FIG. 3 illustrates another example logic circuit.
Figures 4, 5:
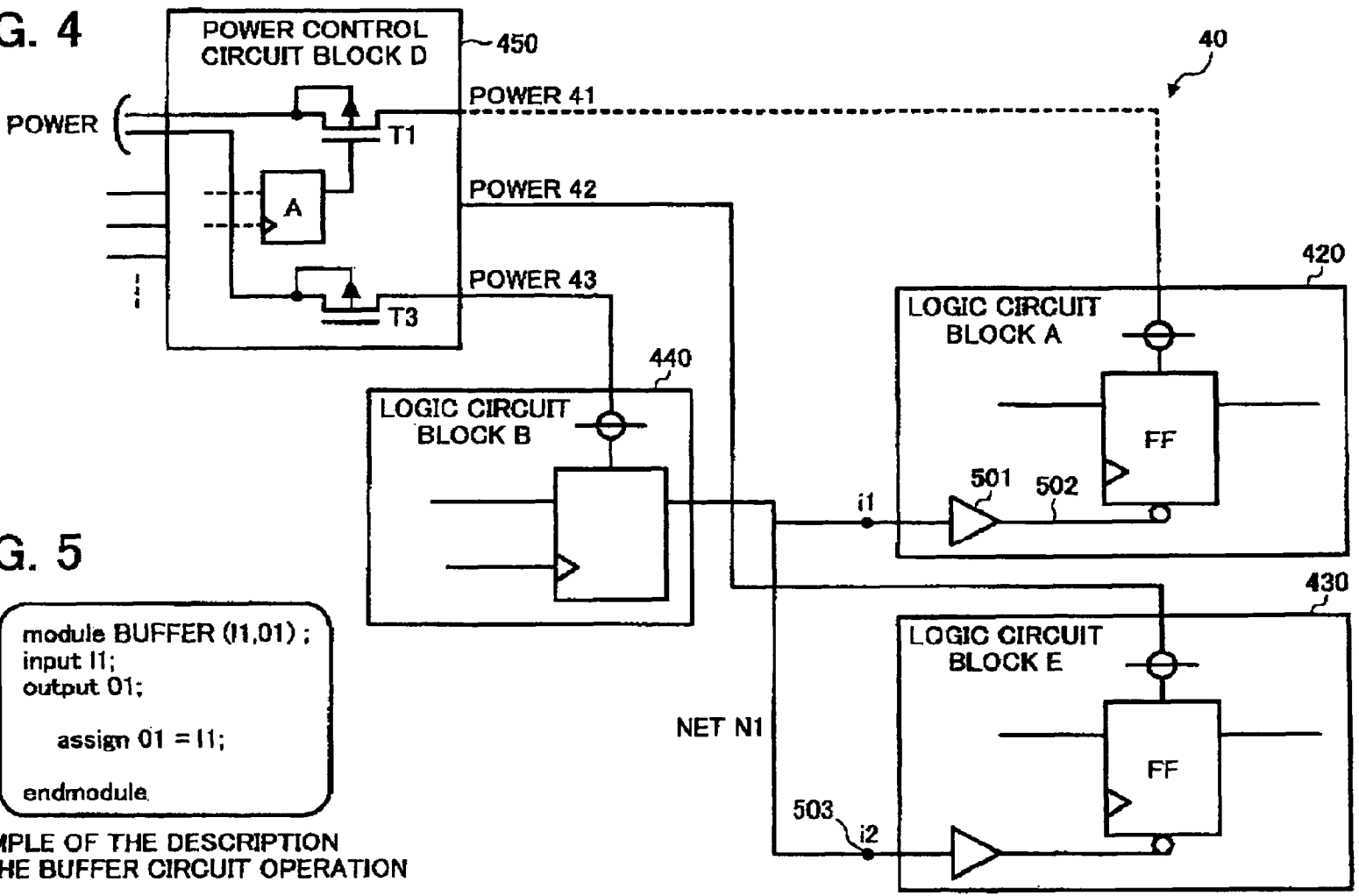
FIG. 4 illustrates another example logic circuit.
FIG. 5 illustrates an example description describing an operation of a buffer element circuit.

FIG. 3 illustrates another example of logic circuit 30 using multi-power suppliers to demonstrate fifth embodiment. The logic circuit 30 includes another logic circuit block E 330 and the power control circuit block D 350 supplies third power 33 in addition to powers 31 and 32. When logical "Z" is inputted to the input terminal i1 using one of commercial CAD software tools, logical "Z" may be inputted to the input terminal i2 unintentionally because of the existence of a common line, i.e., a net N1. In order to avoid such erroneous input of logical "Z", an input buffer 501 is provided to each one of the circuit blocks. FIG. 4 illustrates an example of a logic circuit in which the input buffer 501 is arranged in the logic circuit block A 420. By thus introducing the buffers, such as buffer 501 shown in FIG. 4, the output of buffer at node 502 becomes able to be set logical "Z". An arrangement of the buffer in each one of the circuit blocks may be performed with the commercial CAD software tool. It is possible to place buffers outside of the circuit blocks instead of placing buffers inside of the circuit blocks. FIG. 5 shows an example of the description of the buffer circuit operation.

Numerous additional modifications and variations are possible in light of the above teachings. It is therefore to be understood that within the scope of the appended claims, the disclosure of this patent specification may be practiced otherwise than as specifically described herein.

The invention claimed is:

1. A logic circuit simulation apparatus for simulating a logic circuit which includes a plurality of circuit blocks, the apparatus comprising:

a power control signal specifying unit configured to create power control signal information for specifying statuses of a plurality of power control signals in the logic circuit;

a logic circuit simulation control information generation unit configured to read the power control signal information created by the power control signal specifying unit and to read circuit connection information, said logic circuit simulation control information generation unit configured to generate logic circuit simulation control information based on the power control signal information and the circuit connection information; and a logic circuit simulation unit configured to fix with high impedance each input of a circuit block among the plurality of circuit blocks when said circuit block is not supplied with power in accordance with the logic circuit simulation control information and release the high impedance from [each from] each input of said circuit block when said circuit block is to be supplied with power in accordance with release control information of the logic circuit simulation control information, said logic circuit simulation unit configured to simulate the logic circuit.

2. The logic circuit simulation apparatus according to claim 1, further comprising:

a delay time specifying unit to specify a power-off delay time for the circuit block to which power is not to be supplied.

3. The logic circuit simulation apparatus according to claim 2, wherein the delay time specifying unit is further configured to specify a power-on delay time of release control information generated by the logic circuit simulation apparatus.

4. A method for simulating a logic circuit which includes a plurality of circuit blocks comprising the steps of:

creating power control signal information for specifying statuses of a plurality of power control signals;

reading the power control signal information and circuit connection information;

generating logic circuit simulation control information based on the power control signal information and the circuit connection information;

reading the logic circuit simulation control information for instructing a logic circuit simulation unit to fix with high impedance [each input of] a circuit block to which power is not supplied and to release the high impedance [of each input of] *from* the circuit block when power is to be supplied; and simulating the logic circuit in accordance with the logic circuit simulation control information.

5. The method for simulating a logic circuit which includes a plurality of circuit blocks according to claim 4, comprising further steps of:

specifying delay time from a time the power control signal is changed to a time the power to the circuit block is changed as a result of the change in the power control signal;

reading the delay time; and generating logic circuit simulation control information based on the power control signal information, the delay time and the circuit connection information.

6. The method for simulating a logic circuit which includes a plurality of circuit blocks according to claims 4 or 5, comprising further steps of:

adding buffer circuits at the inputs of the circuit blocks.

7. A logic circuit simulation apparatus for simulating a logic circuit which includes a plurality of circuit blocks, the apparatus comprising:

power control signal specifying means for creating power control signal information for specifying statuses of a plurality of power control signals;

logic circuit simulation control information generation means for reading the power control signal information created by the power control signal specifying means and for reading circuit connection information, said logic circuit simulation control information generation means configured to generate logic circuit simulation control information based on the power control signal information and the circuit connection information; and logic circuit simulation means for fixing with high impedance [each input of] a circuit block of the plurality of circuit blocks, when said circuit block is not supplied with power in accordance with the logic circuit simulation control information and for releasing the high impedance from [each input of] said circuit block when said circuit block is to be supplied with power in accordance with the logic circuit simulation control information, said logic circuit simulation means configured to simulate the logic circuit.

*8. A logic circuit simulation apparatus for simulating a logic circuit which includes a plurality of circuit blocks, the apparatus comprising:*

*a power control signal specifying unit configured to create power control signal information for specifying statuses of a plurality of power control signals in the logic circuit;*

*a logic circuit simulation control information generation unit configured to read the power control signal information created by the power control signal specifying unit and to read circuit connection information, said logic circuit simulation control information generation unit configured to generate logic circuit simulation control information based on the power control signal information and the circuit connection information; and*

*a logic circuit simulation unit configured to fix with high impedance a circuit block among the plurality of circuit blocks when said circuit block is not supplied with power in accordance with the logic circuit simulation control information and release the high impedance from said circuit block when said circuit block is to be supplied with power in accordance with release control information of the logic circuit simulation control information, said logic circuit simulation unit configured to simulate the logic circuit.*

*9. A logic circuit as in claim 8 in which said logic circuit simulation unit is configured to fix with high impedance an input of said circuit block when the circuit block is not supplied with power in accordance with the logic circuit simulation control information and release the high impedance from the input of said circuit block when said circuit block is to be supplied with power in accordance with release control information of the logic circuit simulation control information, said logic circuit simulation unit configured to simulate the logic circuit.*

*10. A logic circuit as in claim 8 in which said logic circuit simulation unit is configured to fix with high impedance an input and an output of said circuit block when the circuit block is not supplied with power in accordance with the logic circuit simulation control information and release the high impedance from the input and the output of said circuit block when said circuit block is to be supplied with power in accordance with release control information of the logic circuit simulation control information, said logic circuit simulation unit configured to simulate the logic circuit.*

*11. A logic circuit as in claim 8 in which said logic circuit simulation unit is configured to fix with high impedance an output of said circuit block when the circuit block is not supplied with power in accordance with the logic circuit simulation control information and release the high impedance from the output of said circuit block when said circuit block is to be supplied with power in accordance with release control information of the logic circuit simulation control information, said logic circuit simulation unit configured to simulate the logic circuit.*

*12. A logic circuit simulation apparatus configured to simulate a logic circuit by reading and using previously provided circuit connection information, comprising:*

*a power control signal specifying means configured to generate power control signal information specifying a power control signal name for controlling a stop and a start of a power supply to each circuit block constituting the logic circuit and a circuit block name for a target control block; and*

*a logic circuit simulation control information generating means configured to:*

*read the circuit connection information and the power control signal information generated by the power control signal specifying means for stopping the power supply to the target control block;*

*read the target control block corresponding to the read circuit block name specified by the read power control signal information from the circuit connection information; and*

*generate logic circuit simulation control information to instruct the logic circuit simulation means to make the target control block to have a logical value X while the power supply to the target control block is stopped, wherein logical value X is an unfixed value that is not a logical "1" or a logical "0,"*

*wherein the logic circuit simulation means simulates, by reading and using the logic circuit simulation control information generated by the logic circuit simulation control information generating means, and the circuit connection information, a state when the power supply to the target control block is stopped; and*

*the logic circuit simulation control information generating means also configured to:*

*read the circuit connection information and the power control signal information generated by the power control signal specifying means for starting the power supply to the target control block; and*

*generate logic circuit simulation control information to instruct the logic circuit simulation means to release the logical value X state of the target control block when the power supply is started,*

*wherein the logic circuit simulation means is configured to simulate the state in which the power supply to the target control block has started by reading and using the logic circuit simulation control information generated by the logic circuit simulation control information generating means.*

*13. A logic circuit simulation apparatus as claimed in claim 12, further comprising:*

*a power delay time specifying means configured to generate power delay time information to specify a stop delay time from a time when a state of a power control signal is changed until a time when the power supply to the target control block is actually stopped, wherein*

*the logic circuit simulation control information generating means generates, by reading and using the power delay time information generated by the power delay time specifying means, the power control signal information generated by the power control signal specifying means for causing the power supply to the target control block to stop, and the circuit connection information, the logic*

*circuit simulation control information including information to instruct the logic circuit simulation means to make the control target circuit to have the logical value X state after the stop delay time specified in the power delay time information; and wherein*

*the logic circuit simulation means is configured to simulate, by reading and using the logic circuit simulation control information generated by the logic circuit simulation control information generating means, the state when the power supply to the target control block is stopped including the stop delay time.*

*14. A logic circuit simulation apparatus as claimed in claim 13, wherein:*

*the power delay time specifying means generates the power delay time information including information specifying the start delay time from when the power control signal is changed until when the power supply to the target control block actually starts;*

*the logic circuit simulation control information generation means generates, by reading and using the power delay time information generated by the power delay time specifying means, the power control signal information generated by the power control signal specifying means for causing the power supply to the target control block to start, and the circuit connection information, the logic circuit simulation control information including information to instruct the logic circuit simulation means to release the target control block from a state of logical value X after the start delay time specified by the power delay time information; and*

*the logic circuit simulation means simulates, by reading and using the logic circuit simulation control information generated by the logic circuit simulation control information generation means, the target control block including the start delay time.*

*15. A method for using a logic circuit simulator to simulate a logic circuit by reading and using previously provided circuit connection information, comprising:*

*using a power control signal specifying unit in the logic circuit simulator to generate power control signal information specifying a power control signal name for controlling a stop and a start of a power supply to each circuit block constituting the logic circuit and a circuit block name for a target control block;*

*using a logic circuit simulation control information generation unit in the logic circuit simulator to read the circuit connection information and the power control signal information for stopping the power supply to the target control block;*

*using the logic circuit simulation control information generation unit to read the target control block corresponding to the read circuit block name specified by the read power control signal information from the circuit connection information;*

*using the logic circuit simulation control information generation unit to generate logic circuit simulation control information to make the target control block have a logical value X while the power supply to the target control block is stopped, wherein logical value X is an unfixed value that is not a logical "1" or a logical "0";*

*using a logic circuit simulation unit in the logic circuit simulator to simulate, by reading and using the logic circuit simulation control information and the circuit connection information, a state when the power supply to the target control block is stopped;*

*generating, by reading the circuit connection information and the power control signal information for starting the power supply to the target control block, the logic circuit simulation control information including instructions to release the logical value X state of the target control block when the power supply is started; and*

*simulating the state in which the power supply to the target control block has started by reading and using the logic circuit simulation control information.*

*16. The method as claimed in claim 15, further comprising:*

*generating power delay time information to specify a stop delay time from a time when a state of a power control signal is changed until a time when the power supply to the target control block is actually stopped;*

*generating, by reading and using the power delay time information, the power control signal information for causing the power supply to the target control block to stop and the circuit connection information, the logic circuit simulation control information including instructions to make the control target circuit have the logical value X state after the stop delay time specified in the power delay time information; and*

*simulating, by reading and using the logic circuit simulation control information, the state when the power supply to the target control block is stopped including the stop delay time.*

*17. The method as claimed in claim 16, further comprising:*

*generating the power delay time information including information specifying the start delay time from when the power control signal is changed until when the power supply to the target control block actually starts;*

*generating, by reading and using the power delay time information, the power control signal information for causing the power supply to the target control block to start and the circuit connection information, the logic circuit simulation control information including instructions to release the target control block from a state of logical value X after the start delay time specified by the power delay time information; and*

*simulating, by reading and using the logic circuit simulation control information, the target control block including the start delay time.*

*18. A method for simulating a logic circuit which includes a plurality of circuit blocks comprising the steps of:*

*creating power control signal information for specifying statuses of a plurality of power control signals;*

*reading the power control signal information and circuit connection information;*

*generating logic circuit simulation control information based on the power control signal information and the circuit connection information;*

*reading the logic circuit simulation control information for instructing a logic circuit simulation unit to fix a circuit block to which power is not supplied with an impedance sufficient to prevent an input to the circuit block of value "1" or "0" from resulting in an output value of either "1" or "0" and to release the impedance from the circuit block when power is to be supplied; and*

*simulating the logic circuit in accordance with the logic circuit simulation control information.*

*19. The method for simulating a logic circuit which includes a plurality of circuit blocks according to claim 18, comprising further steps of:*

*specifying delay time from a time the power control signal is changed to a time the power to the circuit block is changed as a result of the change in the power control signal;*

*reading the delay time; and*

*generating logic circuit simulation control information based on the power control signal information, the delay time and the circuit connection information.*

*20. A logic circuit simulation apparatus configured to simulate a logic circuit by reading and using previously provided circuit connection information, comprising:*

*a power control signal specifying means configured to generate power control signal information specifying a power control signal name for controlling a stop and a start of a power supply to each circuit block constituting the logic circuit and a circuit block name for a target control block; and*

*a logic circuit simulation control information generating means configured to:*

*read the circuit connection information and the power control signal information generated by the power control signal specifying means for stopping the power supply to the target control block;*

*read the target control block corresponding to the read circuit block name specified by the read power control signal information from the circuit connection information; and*

*generate logic circuit simulation control information to instruct the logic circuit simulation means to make the target control block to have a logical value X while the power supply to the target control block is stopped, wherein logical value X is a value that is not a logical "1" or a logical "0,"*

*wherein the logic circuit simulation means simulates, by reading and using the logic circuit simulation control information generated by the logic circuit simulation control information generating means, and the circuit connection information, a state when the power supply to the target control block is stopped; and*

*the logic circuit simulation control information generating means also configured to:*

*read the circuit connection information and the power control signal information generated by the power control signal specifying means for starting the power supply to the target control block; and*

*generate logic circuit simulation control information to instruct the logic circuit simulation means to release the logical value X state of the target control block when the power supply is started,*

*wherein the logic circuit simulation means is configured to simulate the state in which the power supply to the target control block has started by reading and using the logic circuit simulation control information generated by the logic circuit simulation control information generating means.*

*21. A method for manufacturing a logic integrated circuit, comprising:*

*designing the logic circuit by creating circuit connection information for the logic circuit; and*

*simulating the logic circuit using the circuit connection information, and*

*wherein simulating the logic circuit further comprises:*

*creating power control signal information for specifying statuses of a plurality of power control signals;*

*reading the power control signal information and circuit connection information;*

*generating logic circuit simulation control information based on the power control signal information and the circuit connection information;*

*reading the logic circuit simulation control information for instructing a logic circuit simulation unit to fix a circuit block to which power is not supplied with an impedance sufficient to prevent an input to the circuit block of value "1" or "0" from resulting in an output value of either "1" or "0" and to release the impedance from the circuit block when power is to be supplied; and*

*simulating the logic circuit in accordance with the logic circuit simulation control information.*

* * * * *